US009978655B2

(12) United States Patent
Scanlan et al.

(10) Patent No.: US 9,978,655 B2
(45) Date of Patent: *May 22, 2018

(54) SEMICONDUCTOR DEVICE AND METHOD OF ADAPTIVE PATTERNING FOR PANELIZED PACKAGING WITH DYNAMIC VIA CLIPPING

(71) Applicant: DECA TECHNOLOGIES INC., Tempe, AZ (US)

(72) Inventors: Christopher M. Scanlan, Chandler, AZ (US); Craig Bishop, Tucson, AZ (US)

(73) Assignee: DECA Technologies Inc., Tempe, AZ (US)

( * ) Notice: Subject to any disclaimer, the term of this patent is extended or adjusted under 35 U.S.C. 154(b) by 61 days.

This patent is subject to a terminal disclaimer.

(21) Appl. No.: 15/213,291

(22) Filed: Jul. 18, 2016

(65) Prior Publication Data

US 2016/0329257 A1    Nov. 10, 2016

Related U.S. Application Data

(63) Continuation of application No. 14/720,206, filed on May 22, 2015, now Pat. No. 9,397,069, which is a (Continued)

(51) Int. Cl.
*H01L 21/66* (2006.01)
*H01L 21/768* (2006.01)
(Continued)

(52) U.S. Cl.
CPC ........ *H01L 22/32* (2013.01); *H01L 21/76879* (2013.01); *H01L 21/76885* (2013.01);
(Continued)

(58) Field of Classification Search
CPC .................. H01L 24/82; H01L 21/76892
See application file for complete search history.

(56) References Cited

U.S. PATENT DOCUMENTS 5,359,496 A   10/1994   Kornrumpf et al.
5,465,217 A   11/1995   Yip et al.
(Continued)

FOREIGN PATENT DOCUMENTS

RU      2183882 C2    6/2002
WO      WO022894      4/2000

*Primary Examiner* — Dung Le
(74) *Attorney, Agent, or Firm* — Booth Udall Fuller, PLC

(57) ABSTRACT

A semiconductor device and method of adaptive patterning for panelized packaging with dynamic via clipping is described. A panel comprising an encapsulating material disposed around a plurality of semiconductor die can be formed. An actual position for each of the plurality of semiconductor die within the panel can be measured. A conductive redistribution layer (RDL) comprising first capture pads aligned with the actual positions of each of the plurality of semiconductor die can be formed. A plurality of second capture pads at least partially disposed over the first capture pads and aligned with a package outline for each of the plurality of semiconductor packages can be formed. A nominal footprint of a plurality of conductive vias can be adjusted to account for a misalignment between each semiconductor die and its corresponding package outline.

20 Claims, 9 Drawing Sheets

Related U.S. Application Data continuation of application No. 14/302,977, filed on Jun. 12, 2014, now Pat. No. 9,040,316.

(51) Int. Cl.

| | | |
|---|---|---|
| *H01L 23/00* | (2006.01) | |
| *H01L 21/78* | (2006.01) | |
| *H01L 23/544* | (2006.01) | |
| *H01L 23/31* | (2006.01) | |
| *H01L 21/56* | (2006.01) | |

(52) U.S. Cl.
CPC .............. *H01L 21/78* (2013.01); *H01L 22/12* (2013.01); *H01L 22/20* (2013.01); *H01L 23/544* (2013.01); *H01L 24/02* (2013.01); *H01L 24/03* (2013.01); *H01L 24/05* (2013.01); *H01L 24/11* (2013.01); *H01L 24/13* (2013.01); *H01L 24/19* (2013.01); *H01L 24/82* (2013.01); *H01L 24/96* (2013.01); *H01L 21/561* (2013.01); *H01L 21/568* (2013.01); *H01L 21/76897* (2013.01); *H01L 23/3135* (2013.01); *H01L 2223/5446* (2013.01); *H01L 2224/0217* (2013.01); *H01L 2224/0231* (2013.01); *H01L 2224/0239* (2013.01); *H01L 2224/02373* (2013.01); *H01L 2224/02379* (2013.01); *H01L 2224/037* (2013.01); *H01L 2224/0401* (2013.01); *H01L 2224/04105* (2013.01); *H01L 2224/05024* (2013.01); *H01L 2224/05025* (2013.01); *H01L 2224/117* (2013.01); *H01L 2224/12105* (2013.01); *H01L 2224/13026* (2013.01); *H01L 2224/13147* (2013.01); *H01L 2224/24137* (2013.01); *H01L 2224/32245* (2013.01); *H01L 2224/73267* (2013.01); *H01L 2224/8212* (2013.01); *H01L 2224/94* (2013.01); *H01L 2924/0105* (2013.01); *H01L 2924/01013* (2013.01); *H01L 2924/01028* (2013.01); *H01L 2924/01029* (2013.01); *H01L 2924/01047* (2013.01); *H01L 2924/01079* (2013.01); *H01L 2924/01322* (2013.01); *H01L 2924/12041* (2013.01); *H01L 2924/13091* (2013.01); *H01L 2924/15153* (2013.01); *H01L 2924/181* (2013.01)

(56) References Cited

U.S. PATENT DOCUMENTS

| | | |
|---|---|---|
| 6,249,047 B1 | 6/2001 | Corisis |
| 6,392,301 B1 | 5/2002 | Waizman et al. |
| 6,433,419 B2 | 8/2002 | Khandros et al. |
| 6,655,011 B1 | 12/2003 | Kornrumpf et al. |
| 6,833,615 B2 | 12/2004 | Geng et al. |
| 6,836,023 B2 | 12/2004 | Joshi et al. |
| 6,851,100 B1 | 2/2005 | You et al. |
| 6,896,998 B2 | 5/2005 | Mizukoshi |
| 6,965,160 B2 | 11/2005 | Cobbley et al. |
| 7,078,272 B2 | 7/2006 | Ho et al. |
| 7,208,348 B2 | 4/2007 | Geng |
| 7,514,273 B2 | 4/2009 | Hedler |
| 7,659,622 B2 | 2/2010 | Dauksher et al. |
| 7,707,713 B2 | 5/2010 | Akagawa |
| 7,725,862 B2 | 5/2010 | Hummler |
| 7,772,696 B2 | 8/2010 | Hunter |
| 7,928,563 B2 | 4/2011 | Bakir |
| 7,979,813 B2 | 7/2011 | Rumsey et al. |
| 8,004,095 B2 | 8/2011 | Shim et al. |
| 8,053,279 B2 | 11/2011 | Farnworth et al. |
| 8,084,871 B2 | 12/2011 | Rahim et al. |
| 9,397,069 B2 * | 7/2016 | Scanlan ............ H01L 21/76879 |
| 2003/0066040 A1 | 4/2003 | Morgan |
| 2003/0090006 A1 | 5/2003 | Farnworth |
| 2003/0124868 A1 | 7/2003 | Mizukoshi |
| 2004/0032013 A1 | 2/2004 | Cobbley et al. |
| 2004/0049912 A1 | 3/2004 | Akagawa et al. |
| 2005/0248022 A1 | 11/2005 | Badr et al. |
| 2006/0168552 A1 | 7/2006 | Farnworth et al. |
| 2007/0249067 A1 | 10/2007 | Hedler et al. |
| 2008/0136004 A1 | 6/2008 | Yang et al. |
| 2008/0178127 A1 | 7/2008 | Dewkett et al. |
| 2008/0230889 A1 | 9/2008 | Standing |
| 2008/0237828 A1 | 10/2008 | Yang |
| 2008/0288908 A1 | 11/2008 | Hart et al. |
| 2009/0057888 A1 | 3/2009 | Hunter |
| 2010/0180249 A1 | 7/2010 | Rumsey et al. |
| 2010/0203676 A1 | 8/2010 | Theuss et al. |
| 2010/0230795 A1 | 9/2010 | Kriman et al. |
| 2010/0301474 A1 | 12/2010 | Yang |
| 2011/0074041 A1 | 3/2011 | Leung |
| 2011/0108981 A1 | 5/2011 | Rahim et al. |
| 2011/0154277 A1 | 6/2011 | Ankenbauer et al. |
| 2011/0202896 A1 | 8/2011 | Scanlan et al. |

* cited by examiner

SEMICONDUCTOR DEVICE AND METHOD OF ADAPTIVE PATTERNING FOR PANELIZED PACKAGING WITH DYNAMIC VIA CLIPPING

CROSS REFERENCE SECTION TO RELATED APPLICATIONS

This is a Continuation application of earlier U.S. patent application Ser. No. 14/720,206 to Christopher M. Scanlan et al. entitled "SEMICONDUCTOR DEVICE AND METHOD OF ADAPTIVE PATTERNING FOR PANELIZED PACKAGING WITH DYNAMIC VIA CLIPPING," filed May 22, 2015, now pending, which application is a Continuation application of earlier U.S. patent application Ser. No. 14/302,977 to Christopher M. Scanlan et al. entitled "SEMICONDUCTOR DEVICE AND METHOD OF ADAPTIVE PATTERNING FOR PANELIZED PACKAGING WITH DYNAMIC VIA CLIPPING," filed Jun. 12, 2014, now issued as U.S. Pat. No. 9,040,316 on May 26, 2015, the disclosures of which are hereby incorporated herein by reference.

TECHNICAL FIELD

The disclosure relates in general to semiconductor devices and, more particularly, to adaptive patterning of panelized packaging for embedded semiconductor die packages comprising dynamically clipped vias.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products.

Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density, active and passive components. Back-end processes may result in semiconductor device packages with a smaller footprint by improvements in electrical interconnection and packaging materials.

One approach to back-end processing that more efficiently produces packaged semiconductor devices is the use of panelized packaging, in which a number of semiconductor die are formed into a panel and processed simultaneously at a level of a reconstituted wafer or panel. Panelized packaging can be used in back-end manufacturing for forming embedded die packages. One form of panelized packaging used to package semiconductor die is FOWLP. FOWLP involves placing multiple semiconductor die "face down" or with an active surface of the semiconductor die oriented toward a temporary carrier or substrate, such as a temporary tape carrier. The semiconductor die and substrate or carrier is overmolded with an encapsulant, such as an epoxy molding compound, using, for example, a compression molding process. After molding, the carrier tape is removed to expose the active surface of the multiple semiconductor die formed together as a reconstituted wafer. Subsequently, a wafer level chip scale package (WLCSP) build-up interconnect structure, typically including a redistribution layer (RDL), is formed on top of the reconstituted wafer or panel. Conductive bumps are then formed over the build-up interconnect structure as a ball grid array (BGA), which is attached to the reconstituted wafer. After formation of the BGA, the reconstituted wafer is singulated to form individual semiconductor devices or packages. Sometimes, semiconductor die are displaced in the process of being mounted to the substrate and are also displaced during the overmolding processes. Displacement of the semiconductor die, including rotation of the semiconductor die, can result in defective semiconductor packages that decrease package quality and reliability and further increase package yield loss.

Another area of back-end manufacturing that allows for the formation of embedded die packages is the embedding of semiconductor die in substrates, such as printed circuit board (PCB) type structure or printed wiring board panel, wherein the semiconductor die is embedded in inner layers of a multi-layer substrate. Embedded semiconductor die packages can be formed by introducing thinned semiconductor die and buried semiconductor die into inner layers of substrates. Semiconductor die can be buried in cavities within the substrate inner layers, and can also be added to a surface of an inner layer of a substrate, after which build-up technology can then be used to construct a board sandwich with layers disposed above and below the semiconductor die. Including semiconductor die within substrates can supports an industry need of reducing footprints and improving signal performance while advancing the concept of three-dimensional (3D) packaging as part of package integration.

SUMMARY

Accordingly, in one aspect, the present invention is a method of making a semiconductor device that can comprise forming a panel comprising an encapsulating material disposed around a plurality of semiconductor die. An actual position for each of the plurality of semiconductor die within the panel can be measured. A conductive RDL comprising first capture pads aligned with the actual positions of each of the plurality of semiconductor die can be formed. A plurality of second capture pads at least partially disposed over the first capture pads and aligned with a package outline for each of the plurality of semiconductor packages can be formed. A nominal footprint of a plurality of conductive vias can be adjusted to account for a misalignment between each semiconductor die and its corresponding package outline and to connect each of the plurality of conductive vias to one of the plurality of first capture pads and one of the second capture pads.

The method of making the semiconductor device can further comprise forming the plurality of first capture pads as a plurality of RDL capture pads. The plurality of second capture pads can be formed as a plurality of under bump metallization (UBM) pads or land grid array (LGA) pads offset from the RDL capture pads. The nominal footprint of the plurality of conductive vias can be adjusted from a shape substantially equal to a shape of the RDL capture pad to a modified shape substantially equal to a shape of an overlap area, the overlap area being defined by a footprint common to a footprint of the RDL capture pad and a footprint of the UBM pad. The method can further comprise adjusting a size of the overlap area so that the size of the overlap area is inversely proportional to the misalignment between each semiconductor die and its corresponding package outline. The method can further comprise adjusting a size of the overlap area so that the size of the overlap area is inversely proportional to a distance from a center of each semiconductor die. The method can further comprise forming the conductive RDL comprising an end opposite the first capture pad coupled to a copper pillar or a capture pad of one of the plurality of semiconductor die. The method can further comprise forming a shape or size of a conductive via for a first of the plurality of semiconductor die different from a shape or size of a conductive via for a second of the plurality of semiconductor die. The method can further comprise forming the plurality of conductive vias to not extend outside a footprint of the first capture pad or the second capture pad. The method can further comprise defining a minimum via area and forming each of the plurality of conductive vias with a footprint comprising an area greater than the minimum via area. The method can further comprise the minimum area defining a maximum misalignment between each semiconductor die and its corresponding package outline.

In another aspect, the present invention is a method of providing a semiconductor die, forming a first conductive layer comprising a fixed position relative to the semiconductor die, forming a second conductive layer comprising a variable position relative to the semiconductor die, and forming a conductive via comprising an adjusted size or shape coupled to the first conductive layer and the second conductive layer.

The method can further comprise forming the first conductive layer comprising a portion aligned with an actual position of the semiconductor die. The second conductive layer can be formed comprising a portion aligned with a package outline of the semiconductor package and disposed at least partially over the portion of the of the first conductive layer aligned with the actual position of the semiconductor die. The size or shape of the conductive via can be adjusted to account for a misalignment between the portion of the first conductive layer and the portion of the second conductive layer. The method can further comprise adjusting a size of the conductive via so that the size of the conductive via is inversely proportional to the misalignment between the portion of the first conductive layer and the portion of the second conductive layer. The method can further comprise adjusting a size of the conductive via so that the size of the conductive via is inversely proportional to a distance from a center of the semiconductor die. The method can further comprise forming the portion of the first conductive layer as an RDL capture pad, forming the portion of the second conductive layer as a UBM or LGA pad, and adjusting the size or shape of the portion of the first conductive layer from a shape substantially equal to a shape of the RDL capture pad to a modified shape substantially equal to a shape of an overlap area, the overlap area being defined by a footprint common to a footprint of the RDL capture pad and a footprint of the UBM pad. The method can further comprise forming a copper pillar coupled to the semiconductor die. The method can further comprise forming the conductive via to not extend outside a footprint of the first conductive layer and the second conductive layer. The method can further comprise forming the conductive via with a footprint comprising an area greater than a minimum via area. The method can further comprise the minimum area defining a maximum misalignment for the semiconductor die.

In another aspect, the present invention is a method of making a semiconductor device that can comprise providing a semiconductor die comprising an actual alignment different from a nominal alignment, adjusting a nominal size or shape of a conductive via to provide a size and shape for a modified via, and forming the modified via coupled to the semiconductor die based on the nominal alignment of the semiconductor die.

The method can further comprise forming a conductive RDL aligned with the actual alignment of the semiconductor die, forming an UBM pad or LGA pad aligned with a package outline of the semiconductor package, and adjusting the nominal size or shape of the conductive via to account for a misalignment between the semiconductor die and the package outline. The method can further comprise adjusting the nominal size of the conductive via so that a size of the modified via is inversely proportional to the misalignment between the semiconductor die and the package outline. The method can further comprise adjusting the nominal size of the conductive via so that the size of the modified via is inversely proportional to a distance from a center of the semiconductor die. The method can further comprise forming the modified via comprising a shape substantially equal to a shape of an overlap area, the overlap area being defined by a footprint common to a footprint of an RDL capture pad and a footprint of a UBM pad. The method can further comprise forming the modified via to not extend outside a footprint of the RDL capture pad or the UBM pad. The method can further comprise forming the nominal via with a footprint comprising an area greater than a minimum area. The method can further comprise the minimum area defining a maximum misalignment between the semiconductor die and a package outline.

The foregoing and other aspects, features, and advantages will be apparent to those artisans of ordinary skill in the art from the DESCRIPTION and DRAWINGS, and from the CLAIMS.

DETAILED DESCRIPTION

Figure 1A:
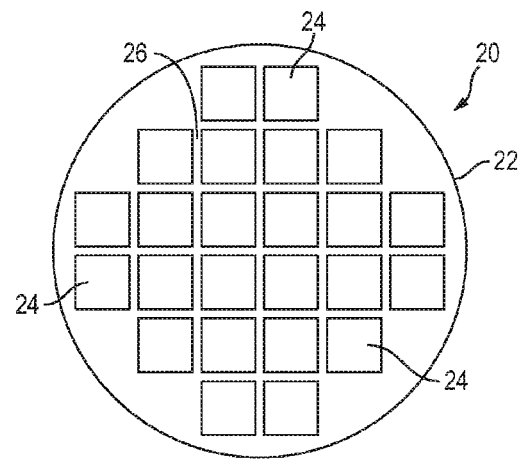
FIGS. 1A-1C illustrate a plurality of semiconductor die for use in a semiconductor package or embedded die package in accordance with an embodiment of the disclosure.

The present disclosure includes one or more embodiments in the following description with reference to the figures, in which like numerals represent the same or similar elements. It will be appreciated by those skilled in the art that the description is intended to cover alternatives, modifications, and equivalents as may be included within the spirit and scope of the disclosure as defined by the appended claims and their equivalents as supported by the following disclosure and drawings.

In the following description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

The terms "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography. Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the layer to be patterned such as surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. Alternatively, some types of materials are patterned by directly depositing material into the areas or voids formed by the photoresist or by a previous deposition/etch process using techniques such as electroless and electrolytic plating. The chemistry of photoresists is such that the photoresist remains substantially intact and resists removal by chemical etching solutions or plating chemistries while the portion of the top layers of the semiconductor wafer not covered by the photoresist is removed or is added to by plating. The process of forming, exposing, and removing the photoresist, as well as the process of removing a portion of the semiconductor wafer or adding to a portion of the wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from a relatively nonsoluble condition to a much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer.

Alternatively, photolithography can be accomplished without the use of a photoresist when the material to be patterned is itself photosensitive. In this case, the photosensitive material is coated on the device surface using spin coating, lamination, or other suitable deposition technique. A pattern is then transferred from a photomask to the photosensitive material using light in an operation typically called exposure. In an embodiment, the portion of the photosensitive material subjected to light is removed, or developed, using a solvent, exposing portions of the underlying layer. Alternatively, in another embodiment, the portion of the photosensitive material not subjected to light is removed, or developed, using a solvent, exposing portions of the underlying layer. The remaining portions of the photosensitive film can become a permanent part of the device structure.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, surface lapping machine, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

In the following discussion, certain embodiments are described with regard to the formation of a single die FOWLP, though embodiments of the disclosure are not limited to such. Embodiments of the disclosure may be used in any panelized packaging application including single-die applications, multi-die modules, die embedded in a printed wiring board panel or PCB, some combination of a die(s) and a passive component(s) within a module, or some combination of one or more device unit(s) and another component(s) within a module. In one aspect, embodiments of the disclosure may eliminate or reduce package or module assembly yield loss caused by misalignment of the device unit or other component during panelization. In another aspect, embodiments of the disclosure may maintain compliance to the package or module outline and not require changes to the position of UBM pads or BGA balls. Maintaining compliance with the package or module outline can be consistently achieved in the final product, for example as end-product package, test socket, etc. In another aspect, embodiments of the disclosure may allow for a smaller bond pad opening on the device units.

FIG. 1A shows a plan view of a semiconductor wafer 20 with a base substrate material 22, such as, without limitation, silicon, germanium, gallium arsenide, indium phosphide, or silicon carbide, for structural support. A plurality of semiconductor die or components 24 is formed on wafer 20 separated by a non-active, inter-die wafer area or saw street 26 as described above. Saw street 26 provides cutting areas to singulate semiconductor wafer 20 into individual semiconductor die 24.

Figure 1B:
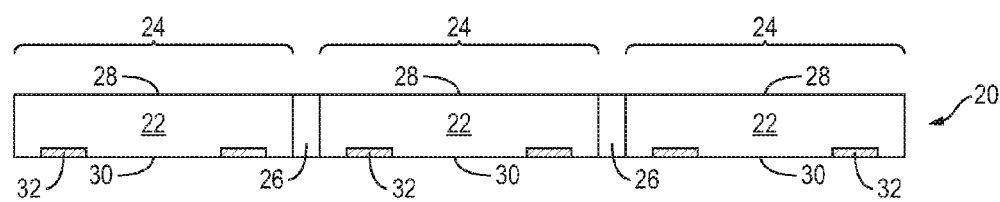

FIG. 1B shows a cross-sectional view of a portion of semiconductor wafer 20 shown previously in the plan view of FIG. 1A. Each semiconductor die 24 has a backside or back surface 28 and active surface 30 opposite the backside. Active surface 30 contains analog or digital circuits implemented as active devices, passive devices, conductive layers, and dielectric layers formed within the die and electrically interconnected according to the electrical design and function of the semiconductor die. For example, the circuit may include one or more transistors, diodes, and other circuit elements formed within active surface 30 to implement analog circuits or digital circuits, such as DSP, ASIC, memory, or other signal processing circuit. Semiconductor die 24 may also contain integrated passive devices (IPDs), such as inductors, capacitors, and resistors, for RF signal processing.

An electrically conductive layer 32 is formed over active surface 30 using PVD, CVD, electrolytic plating, electroless plating process, or other suitable metal deposition process. Conductive layer 32 can be one or more layers of aluminum (Al), copper (Cu), tin (Sn), nickel (Ni), gold (Au), silver (Ag), or other suitable electrically conductive material. Conductive layer 32 operates as contact pads or bond pads electrically connected to the circuits on active surface 30. Conductive layer 32 can be formed as contact pads disposed side-by-side a first distance from the edge of semiconductor die 24, as shown in FIG. 1B. Alternatively, conductive layer 32 can be formed as contact pads that are offset in multiple rows such that a first row of contact pads is disposed a first distance from the edge of the die, and a second row of contact pads alternating with the first row is disposed a second distance from the edge of the die. In another embodiment, conductive layer 32 can be formed as contact pads disposed in an array across an entire surface area of semiconductor die 24. The full array of contact pads can be formed in a regular or irregular pattern across the entire surface of semiconductor die 24 according to the configuration and design of the semiconductor die. Similarly, a size, shape, or orientation of the contact pads can also be irregular with respect to each other and can include a length of conductive material that routes signals laterally across active surface 30 of semiconductor die 24.

Figure 1C:
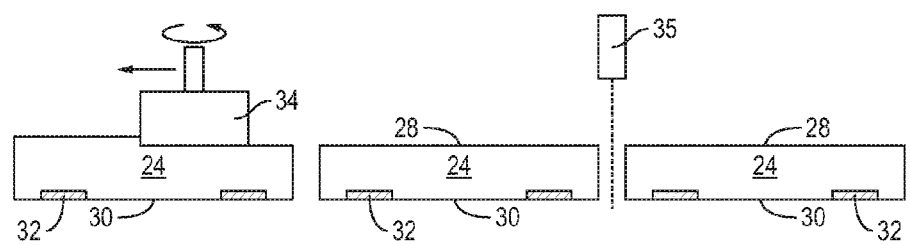

In FIG. 1C, semiconductor wafer 20 undergoes an optional grinding operation with grinder 34 to planarize the surface and reduce thickness of the semiconductor wafer. A chemical etch can also be used to remove and planarize semiconductor wafer 20. Semiconductor wafer 20 is singulated through saw street 26 using a saw blade or laser cutting tool 35 into individual semiconductor die 24.

Figure 2A:
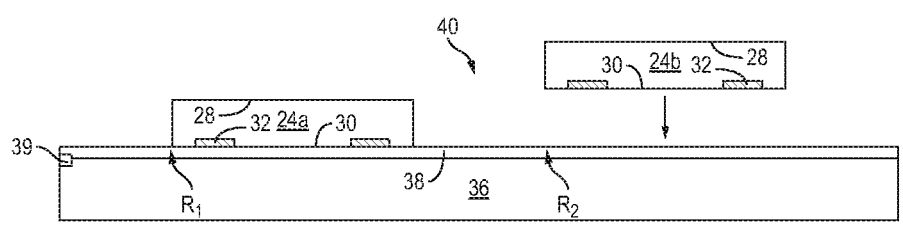
FIGS. 2A-2K illustrate views of a method of forming a semiconductor package or embedded die package comprising adaptively patterning conductive vias.
Figure 2B:
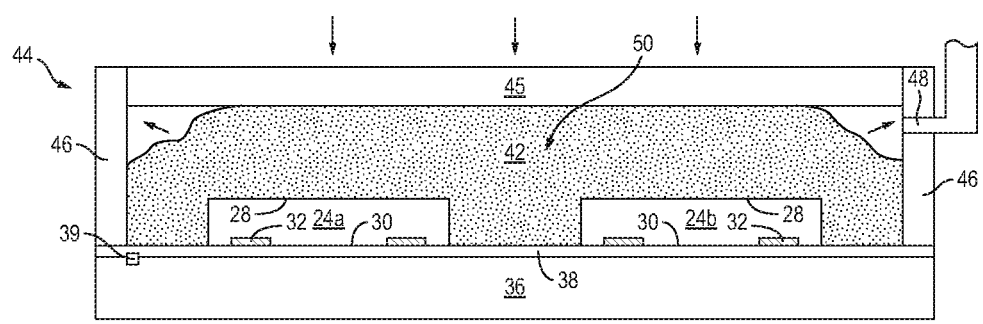

FIG. 2A shows a carrier or substrate 36 containing temporary or sacrificial base material such as silicon, polymer, stainless steel, or other suitable low-cost, rigid material for structural support. An optional interface layer or double-sided tape 38 is formed over carrier 36 as a temporary adhesive bonding film or etch-stop layer. Alternatively, interface layer 38 can serve as and adhesive bonding film layer and also be incorporated within the completed semiconductor package as a permanent film, a portion of which remains in contact with semiconductor die 23, and a portion of which can be removed from over contact pads 32. In an embodiment, carrier 36 can be a ring-shaped film frame comprising an open center portion that supports tape 38 at a periphery of the tape. Alternatively, as shown in FIGS. 2A and 2B, carrier 36 can be a flat plate without an open center area that supports tape 38 across an upper surface of carrier 36. A number of fiducial alignment marks 39 can be positioned over or attached to substrate 36 or interface layer 38. Alternatively a portion of substrate 36 or an interface layer 38 is removed or marked to form a fiducial 39. In other instances, an alignment position can be identified and maintained as a relationship between a substrate 36 and machinery or processing equipment used in handling the substrate. Fiducial 39 allows for orientation and handling of substrate 36 with respect to the subsequent mounting of semiconductor die 24.

FIG. 2A further shows semiconductor die 24 from FIG. 1C mounted face down to carrier 36 and interface layer 38 with backside 28 oriented away from the substrate and active surface 30 oriented toward the carrier. Semiconductor die 24 can be placed over carrier 36 using a pick and place operation or other suitable operation. An adhesive can be optionally disposed between active surface 30 of semiconductor die 24 and carrier 36 when semiconductor dice 24 are mounted with the active surface oriented towards the carrier. Semiconductor die 24 can also be mounted directly to interface layer or support tape 38 without use of the optional adhesive.

In another embodiment, semiconductor die 24 from FIG. 1C can be mounted face up to carrier 36 and interface layer 38 with backside 28 oriented towards the substrate and active surface 30 oriented away from the carrier. Semiconductor die 24 can be placed over carrier 36 using a pick and place operation or other suitable operation. Mounting semiconductor die 24 in a face up configuration can be advantageous when electrical interconnects, such as pillars made of copper or other suitable conductive material, are formed over semiconductor die 24 and connected to contact pads 32 before the semiconductor die are placed over carrier 36 or interface layer 38. However, semiconductor die 24 can also be mounted in a face down configuration when coupled to electrical interconnects such as conductive pillars. When mounting semiconductor die 24 in a face up configuration, an adhesive can be optionally disposed between backside 28 of the semiconductor die and carrier 36 when the semiconductor die are mounted with backside 28 oriented towards the carrier. The optional adhesive can be thermal epoxy, epoxy resin, B-stage epoxy film, ultraviolet (UV) B-stage film with optional acrylic polymer, or other suitable material. In an embodiment, the optional adhesive can be disposed over backside 28 before semiconductor die 24 are mounted over carrier 36. Alternatively, the optional adhesive can be disposed on carrier 36 before mounting the semiconductor die to the carrier. In other embodiments, semiconductor die 24 are mounted directly to interface layer or support tape 38 without use of the optional adhesive.

Semiconductor die 24 are positioned with respect to fiducial 39 according to a nominal or predetermined position and spacing for the semiconductor die. Fiducial 39 can be formed as a depression or protrusion in an upper surface of carrier 36 or between the upper surface of substrate 36 and an upper surface of tape 38. Fiducial 39 serves as an identifying mark for positioning measuring a position, or both, of a number of objects coupled to or disposed on the carrier. The nominal positions selected for each of semiconductor die 24 are determined as part of a nominal or predetermined panel design that facilitates the formation of semiconductor packages or embedded die packages for each semiconductor die 24. The nominal panel design provides adequate space for the formation of fan-out build-up interconnect structures for each semiconductor die 24 and singulation among the final semiconductor packages. Accordingly, FIG. 2A shows a first semiconductor die 24a is mounted or disposed over substrate 36 at a point of reference R1, as measured from fiducial 39, that corresponds to the location of the first semiconductor die within the nominal panel design. Similarly, a second semiconductor die 24b is mounted or disposed over substrate 36 at a point of reference R2, as measured from one or more fiducials 39, that corresponds to the location of the second semiconductor die within the nominal panel design. While point of reference R1 and R2 are, for convenience, referred to as a "points," points of reference R1 and R2 can actually comprise two or more points or a single feature, shape, or element that conveys information in at least two dimensions.

Semiconductor die 24 are mounted to carrier 36 such that the semiconductor die are separated by a space or gap 40 when mounted over carrier 36 that provides an area for an interconnect structure as part of a WLCSP, such as a subsequently formed fan-out interconnect structure. A size of gap 40 includes sufficient area for optionally mounting semiconductor devices or components within the subsequently formed semiconductor packages.

FIG. 2B shows an encapsulant 42 is deposited using a paste printing, compression molding, transfer molding, liquid encapsulant molding, lamination, vacuum lamination, spin coating, or other suitable applicator. Specifically, FIG. 2B shows a mold 44 with a plurality of sidewalls 46 brought together with top portion or plate 45, carrier 36, and interface layer 38 to enclose semiconductor die 24 within the mold for subsequent encapsulation. Mold 44 can also include a bottom portion on which carrier 36 is placed and to which sidewalls 46 can be in contact. In an embodiment, carrier 36 and interface layer 38 serve as the bottom mold portion for the subsequent encapsulation process. Alternatively, semiconductor die 24, carrier 36, and interface layer 38 may be disposed within a mold including multiple portions, such as top and bottom portions. Mold 44 is brought together by moving mold 44 around semiconductor die 24, or alternatively, by moving the semiconductor die into the mold.

FIG. 2B further shows mold 44 encloses semiconductor die 24 with a cavity or open space 50. Cavity 50 extends between mold 44 to semiconductor die 24 and interface layer 38. A volume of encapsulant 42 is disposed over semiconductor die 24 and carrier 36. Inlet 48 can be an exhaust port that does not provide an escape path for encapsulant 42. Encapsulant 42 can be a polymer composite material, such as epoxy resin with filler, epoxy acrylate with filler, or polymer with proper filler. The volume of encapsulant 42 is measured according to the space requirements of cavity 50 less the area occupied by semiconductor die 24 and any additional semiconductor devices that might be present. Encapsulant 42 is disposed over semiconductor die 24 and between sidewalls 44.

Top portion 45 of mold 44 can move along sidewalls 46 toward encapsulant 42 and semiconductor die 24 until the top portion contacts the encapsulant to evenly disperse and uniformly distribute encapsulant 42 within cavity 50 around semiconductor die 24. A viscosity and elevated temperature of encapsulant 42 can be selected for uniform coverage, for example, a lower viscosity and elevated temperature can increase the flow of the encapsulant for molding, paste printing, and spin coating. The temperature of encapsulant 42 can also be controlled within cavity 50 to promote curing of the encapsulant. Semiconductor die 24 are embedded together in encapsulant 42, which is non-conductive and environmentally protects the semiconductor device from external elements and contaminants.

When vacuum compression molding is used, a sacrificial release film can be disposed between top portion 45 and sidewalls 46 of cavity 50 and encapsulant 42 within the cavity to prevent the encapsulant from sticking, or attaching, to the top portion and sidewalls of the cavity. When other types of molding are used, such as transfer molding, the sacrificial release film can be omitted and encapsulant 42 can contain a mold release agent, or an interior surface of cavity 50 can be treated with a mold release agent to prevent the encapsulant from attaching to the interior surface of the mold.

As indicated above, semiconductor die 24 can be mounted in a face up or face down orientation with respect to carrier 36. Thus, the encapsulation shown in FIG. 2D with semiconductor die 24 oriented face down in equally applicable to semiconductor die oriented face up that can include conductive interconnects coupled to the semiconductor die, such as copper pillars. Accordingly, while the processing shown subsequently in FIGS. 2C-2K is shown with respect to the packaging of semiconductor die 24 encapsulated in a face down orientation without conductive interconnects coupled to contact pads 32, the subsequent processing is likewise applicable to a face down orientation with conductive interconnects coupled to the contact pads and to face up orientations with and without conductive interconnects coupled to the contact pads.

Figure 2C:
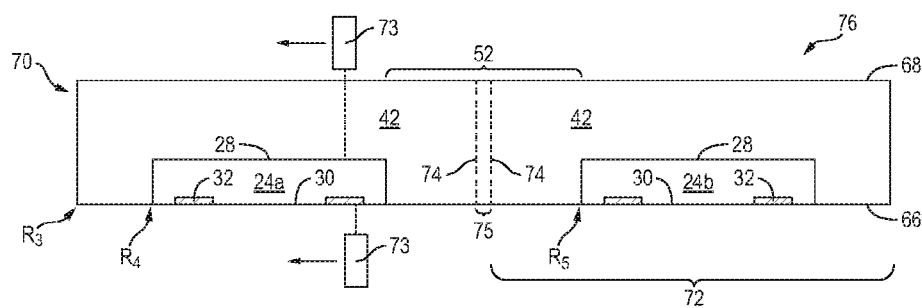

In FIG. 2C, semiconductor die 24 are removed from mold 44, and panel 70 optionally undergoes a curing process to cure encapsulant 42. Carrier 36 and interface layer 38 can be removed by chemical etching, mechanical peeling, CMP, mechanical grinding, thermal bake, UV light, laser scanning, wet stripping, or other suitable process to expose surface 66 of encapsulant 42 opposite surface 68. In an embodiment, encapsulant 42 is cured, either partially or entirely, before carrier 26, interface layer 38, or both, are removed. Alternatively, encapsulant 42 can be cured, either partially or entirely, after carrier 26, interface layer 38, or both are removed. In some embodiments, carrier 36 is removed and interface layer 38 remains as a permanent interface layer, which becomes part of a final semiconductor package. Surface 66 of encapsulant 42 is substantially coplanar with active surface 30 and contact pads 32 of semiconductor die 24, each of which can be exposed by the removal of carrier 36 and interface layer 38. After removal of carrier 36 and interface layer 38, FIG. 2C shows encapsulant 42 disposed around semiconductor die 24 to form an embedded die panel 70. Panel 70 includes a footprint or form factor of any shape and size that allows for, and facilitates, the subsequent processing required to form semiconductor packages as described in greater detail below. As shown in FIG. 2D, in an embodiment, panel 70 includes a form factor similar to the form factor of a 300 millimeter (mm) semiconductor wafer and includes a circular footprint having a diameter of 300 mm. However, panel 70 can include formats such as rectangular or square. In an embodiment, panel 70 may be what is known in the art as a reconstituted wafer.

Panel 70 can also undergo an optional grinding operation with a grinder to planarize the surface and reduce a thickness of the panel. A chemical etch can also be used to remove and planarize a portion of encapsulant 42 in panel 70. Thus, when interconnect structures such as copper pillars or copper traces are coupled to contact pads 32 of semiconductor die 24, a surface of the interconnect structures can be exposed with respect to encapsulant 42 at a bottom surface or face of panel 70 to provide for electrical connection between semiconductor die 24 and a subsequently formed fan-out interconnect structure.

FIG. 2C further shows scanner 73 inspecting panel 70 to determine a true or actual position of semiconductor die 24 within panel 70. Scanner 73 uses optical imaging, acoustic imaging, magnetic imaging, radiofrequencies, infrared, or other suitable process to determine a true or actual position of semiconductor die 24, or a true or actual position of other object including optional semiconductor devices 24 within panel 70. The true position including an x-y displacement, a rotation θ, or both, of each semiconductor die 24 or other object within panel 70 is determined with respect to fiducial or a global point of reference R3 on panel 70. While point of reference R3 is referred to, for convenience, as a point, point of reference R3 can comprise two or more points of elements as a frame of reference for determining movement or rotation in at least two dimensions. Additionally, point of reference R3 can further comprise or a single feature that includes a length, width, or two or more dimensions or directions that allow the single element to serve as a frame of reference for determining movement or rotation in at least two dimensions, such as x and y, or horizontal and vertical displacement in perpendicular lateral directions across a surface of panel 70.

Point of reference R3 can include any number of fiducials transferred from substrate 36 with the formation of encapsulant 42 and the removal of substrate 36 and interface layer 38. Point of reference R3 further includes a number of new fiducial alignment marks that are positioned over or attached to panel 70, or are formed by marking or removing a portion of encapsulant 42. Alternatively, point of reference R3 is not physically identified as part of panel 70, but instead is associated with a portion of scanner 73 or an attachment point to scanner 73 or other processing equipment or machinery. In another embodiment, point of reference R3 can be selected from one or more die 24 embedded within panel 70 so that a global frame of reference for the panel can be determined base on a true position of one or more semiconductor die 24 within the panel.

Scanner 73 inspects features on each semiconductor die 24 to determine actual position and rotation of every semiconductor die in panel 70 with respect to point of reference R3. The features identified by scanner 73 on each semiconductor die 24 include a location of an edge or corner of the semiconductor die, a position of contact pad 32 including a corner, center, or outline of the contact pad, or any other feature on or associated with the semiconductor die. The actual or measured position of semiconductor die 24 includes an x-y position that accounts for a lateral or translational shift in one or more directions of the semiconductor die with respect to a point of reference R3. Similarly, the actual or measured position of semiconductor die 24 also includes an orientation or angular rotation with respect to point of reference R3.

As illustrated in FIG. 2C, first semiconductor die 24a is encapsulated within panel 70 and is located at point of reference R4, which is measured with respect to point of reference R3. Point of reference R4, like point of reference R3, can be two or more points or single feature or shape conveying information in at least two dimensions. Similarly, second semiconductor die 24b is encapsulated within panel 70 at a point of reference R5, which is measured with respect to point or reference R3. Point of reference R5, like points of reference R3 and R4, can be two or more points or single feature or shape conveying information in at least two dimensions. When semiconductor die 24 are precisely and accurately placed at points of reference R1 and R2, and the semiconductor die do not undergo any movement or shifting during encapsulation, R1 and R2 are equal to R4 and R5, respectively. However, movement of semiconductor die 24 from the nominal position of the predetermined panel design results in points of reference R4 and R5 being different from points of reference R1 and R2, respectively. Movement of semiconductor die 24 away from their nominal positions and point of reference R3 results from inaccuracies in mounting the semiconductor die over substrate 36. Additionally, movement of semiconductor die 24 also results from shifts in the position of the semiconductor die, which occur during encapsulation. For example, a force resulting from encapsulant 42 contacting semiconductor die 24 can cause semiconductor die 24 to shift with respect to point of reference R3 and shift with respect to the nominal position of the semiconductor die within the predetermined panel design, that is, points of reference R1 and R2.

After the true position and orientation of each semiconductor die 24 within panel 70 is determined by scanner 73, the true positions of the semiconductor die, for example, R4 and R5, can be compared to the nominal positions of the semiconductor die within the nominal panel design, for example R1 and R2, to determine the change of position or shift of each semiconductor die 24 that occurred during processing. By ascertaining the difference in position between the nominal or original design position of semiconductor die 24 and the actual position of the semiconductor die, potential problems with the subsequent formation of a fan-out build-up interconnect structure over the semiconductor die 24 can be identified and averted. Alternatively, the true position of semiconductor die 24 can be used to identify potential problems with the subsequent formation of a fan-out build-up interconnect structure over the semiconductor die 24 can be identified and averted without reference to the difference in position between the nominal or original design position of the semiconductor die.

A potential problem exists if a true position of a semiconductor die 24, for example, R4 and R5, has shifted such that the true position of a contact pad 32 on the semiconductor die will no longer align or provide a good electrical connection with the subsequently formed fan-out build-up interconnect structure. A fan-out build-up interconnect structure originally designed for nominal positions of semiconductor die 24, or other features within panel 70, may not align with some semiconductor die 24 for a build-up interconnect structure designed based on the nominal positions of the semiconductor die within the panel design, for example, R1 and R2. Alternatively, an effective pitch of the build-up interconnect structure might need be increased for a build-up interconnect structure design to ensure good electrical connections. However, the increased pitch results in lower packaging densities as a result of accounting for differences between nominal and actual positions of semiconductor die 24. In order to maintain decreased pitches for the build-up interconnect structure, as well as ensure good electrical interconnection among various layers and components of the build-up interconnect structure, at least a portion of an original design for the fan-out build-up interconnect structure is modified before being applied to panel 70 to avoid the problems of misalignment and inadequate electrical connections between the interconnect structure and semiconductor die 24. While various specific features of the build-up interconnect structure are used as non-limiting examples of how a truncated via can be used in adaptively providing electrical interconnection, a truncated via can be used to connect any layer or feature that is fixed with respect to the package outline to any other layer or feature that is variable with respect to the package outline due to variation in die position within the semiconductor package.

In an embodiment, position data for semiconductor die 24 can be imported into an adaptive pattern auto-router, as described in application Ser. No. 13/891,006, the disclosure of which is incorporated herein in its entirety. Thus, an adaptive patterning system can account for the true or measured positions of semiconductor die 24 and produce a new design that adjusts or selects new locations for at least a portion of the fan-out build-up interconnect structure, as described in greater detail below. Individual package designs for each semiconductor die or encapsulated semiconductor die units 76 can be combined to form a drawing for an entirety of panel 70 for each feature to be adapted or adjusted. The difference in shift from nominal to true positions can dictate how the individual package designs are combined to form the full panel design. Alternatively, the true or measured positions can dictate how the individual package designs are determined and combined to form a customized, individualized, or adaptive full panel design for panel 70. In an embodiment, design files for each semiconductor die unit 76 can be imported to a lithography machine that uses the design data to dynamically apply a custom, individualized, adaptive pattern to each panel 70.

FIG. 2D shows a plan view or top view of panel 70 including a plurality of semiconductor die 24 separated by spaces 52 disposed between semiconductor die 24. Spaces 52 result from encapsulant 42 filling cavities 50 that are between the semiconductor die during the placement of the semiconductor die over carrier 36 or interface layer 38. A peripheral area 72 is formed around each semiconductor die 24 as a result of encapsulant 42 forming spaces 52. Peripheral area 72 facilitates the subsequent formation of a fan-out build up interconnect structure for each semiconductor die 24 as described below in greater detail. An outer edge of peripheral area 72 is defined by a package outline 74 that extends through spaces 52 and around each semiconductor die 24. Package outlines 74 delineate an outer profile or package edge of encapsulated semiconductor die units 76, wherein each semiconductor die unit comprises a semiconductor die 24 and a peripheral area 72. Package outlines 74 further delineate an edge of a saw street or scribe 75 that will be removed in order to separate or singulate encapsulated semiconductor die units 76 from each other and from panel 70. Package outlines 74 also delineate an edge of the subsequently formed WLCSPs, which comprise encapsulated semiconductor die units 76 and a build up interconnect structure.

As shown in FIG. 2D, panel 70 can be singulated into a plurality of encapsulated semiconductor die units 76, each semiconductor die unit including a single semiconductor die 24. Alternatively, encapsulated semiconductor die units 76 can also comprise a plurality of semiconductor die 24 to form multi-die packages or modules. That is, a single semiconductor die units 76 can include one or more semiconductor die 24, one or more passive devices (such as capacitor, inductor or resistor), and one or more other components (such as an optical element, connector, or other electronic component). A variety of combinations of active devices, passive devices, and other components are optionally included within semiconductor die units 76 and are envisioned in accordance with embodiments of the disclosure.

Figure 2E:
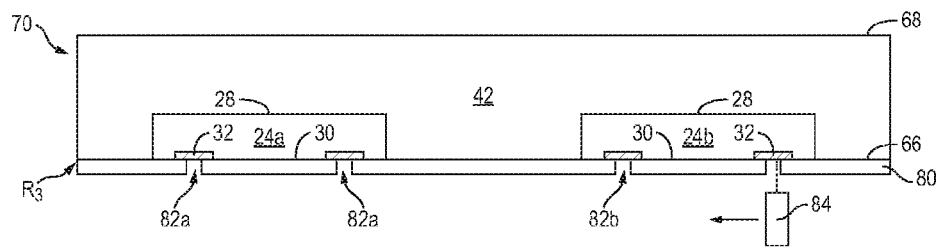

In FIG. 2E, a first portion of a fan-out build-up interconnect structure is formed over panel 70 by the deposition and patterning of insulation or passivation layer 80. Insulating layer 80 is conformally applied to, and has a first surface that follows the contours of, encapsulant 42 and semiconductor die 24. Insulating layer 80 has a second planar surface opposite the first surface. Insulating layer 80 contains one or more layers of photosensitive low curing temperature dielectric resist, photosensitive composite resist, laminate compound film, insulation paste with filler, solder mask resist film, liquid molding compound, silicon dioxide (SiO2), silicon nitride (Si3N4), silicon oxynitride (SiON), aluminum oxide (Al2O3), or other material having similar insulating and structural properties. Insulating layer 80 is deposited using printing, spin coating, spray coating, lamination, or other suitable process. Insulating layer 80 is subsequently patterned and optionally cured.

A portion of insulating layer 80 is removed by etching, laser drilling, mechanical drilling, or other suitable process to form openings 82. Openings 82 extend completely through insulating layer 80 and expose contact pads 32 of semiconductor die 24. When changes in the positions of semiconductor die 24 are small with respect to point of reference R3, no adjustments to the positions of openings 82 may be required to properly align the openings with contact pads 32. Thus, the adaptive patterning for packaging semiconductor die 24 includes measuring the true position of semiconductor die 24, and determining whether the shifts or movement of the semiconductor die require changes to the positions of openings 82. If the changes in position of contact pads 32 are such that the nominal position of openings 82 do not provide sufficient contact with the contact pads, then adjustments to the position of openings 82 will be made.

Adaptive patterning can adjust the position of each opening 82 individually, or adjust positions of a number of openings 82 simultaneously. For example, a number of openings 82 form a unit pattern that relates to a single semiconductor die 24 within panel 70, which are adjusted together as a unit. The positions of openings 82 are adjusted, either individually or in groups, by an x-y translation or by rotation of an angle θ with respect to point of reference R3 on panel 70. For example, a first portion of openings 82, designated as openings 82a in FIG. 2E, is adjusted by an x-y translation or by rotation of an angle θ according to the true position of semiconductor die 24a within panel 70 as measured with respect to point of reference R3. Similarly, a second portion of openings 82, designated as openings 82b in FIG. 2E, is adjusted by an x-y translation or by rotation of an angle θ according to the true position of semiconductor die 24b within panel 70 as measured with respect to point of reference R3. The adaptive patterning of openings 82 occurs, as needed, for each semiconductor die 24 within panel 70. In an embodiment, openings 82 are formed using a proprietary design tool that modifies or adjusts the fan-out unit design for each package on panel 70 so that conductive vias subsequently formed in openings 82 are properly aligned to contact pads 32. When changes in the positions of openings 82 are small with respect to point of reference R3, no additional adjustments to the build-up interconnect structure may be required. Alternatively, the nominal positions of other portions of the build-up interconnect layer are changed in addition to changing a position of openings 82, as described in greater detail below.

Figure 2F:
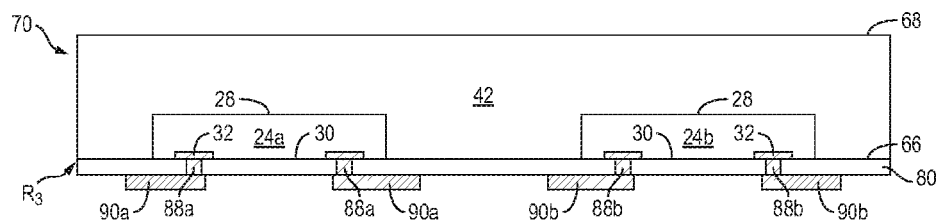
Figure 2D:
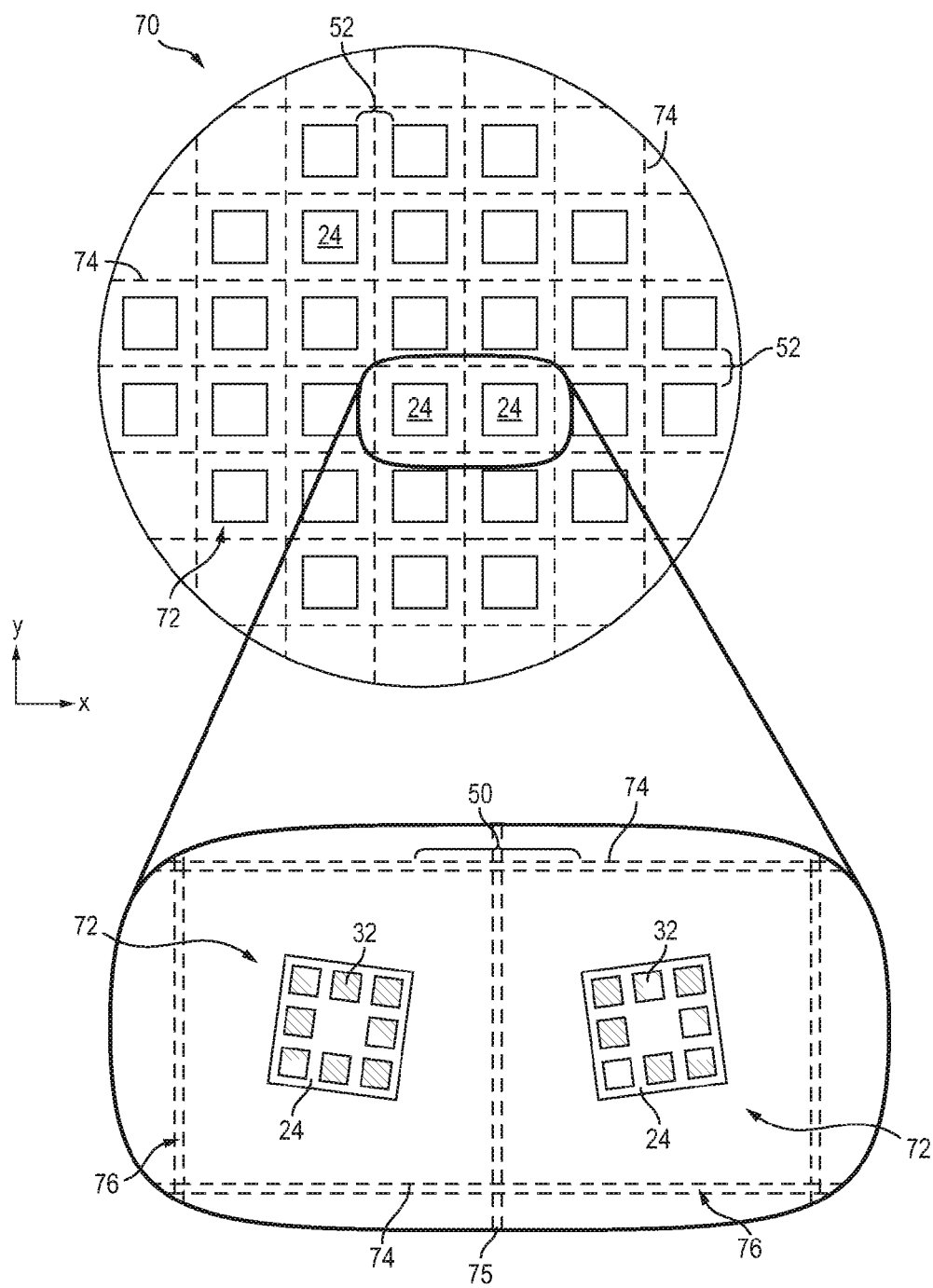

In FIG. 2F, an electrically conductive layer is deposited in openings 82 using PVD, CVD, electrolytic plating, electroless plating, or other suitable process to form conductive vias 88. Conductive vias 88 can be one or more layers of Al, Cu, Sn, Ni, Au, Ag, titanium (Ti), tungsten (W), poly-silicon, or other suitable electrically conductive material. Conductive vias 88 form part of the build-up interconnect structure and provide vertical electrical connection with contact pads 32.

Figure 2G:
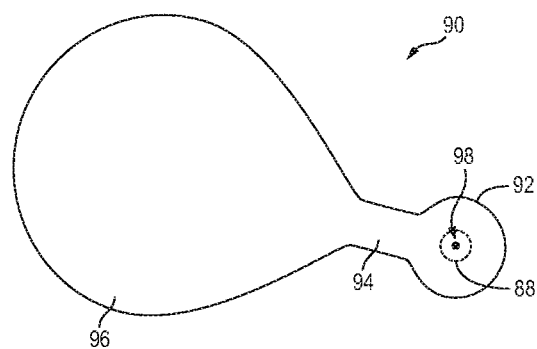

FIG. 2F also shows an electrically conductive layer 90 is patterned and deposited over insulating layer 80 and conductive via 88 as a RDL. Conductive RDL 90 can be one or more layers of Al, Cu, Sn, Ni, Au, Ag, or other suitable electrically conductive material. The deposition of conductive RDL 90 uses PVD, CVD, electrolytic plating, electroless plating, or other suitable process. In an embodiment, conductive RDL 90 is formed together with conductive via 88 at a same time. Alternatively, conductive via 88 and conductive RDL 90 are formed as part of separate processes and at different times. FIG. 2G is a plan view of a portion of conductive RDL 90 that includes a first via capture pad 92, a trace 94, and a second via capture pad or RDL capture pad 96. The first via capture pad 92 can be disposed over insulating layer 80 and conductive via 88. Conductive RDL 90 includes trace 94, which is formed over insulating layer 80 and extends from first via capture pad 92 to RDL capture pad 96. RDL capture pad 96 contacts trace portion 94 of conductive RDL 90 and is opposite first via capture pad 92. In an embodiment, trace 94 includes a width less than a width of the first via capture pads 92 and RDL capture pad 96. In another embodiment, a stacked via can be employed in which conductive RDL 90 comprises RDL capture pad 96, but does not include first via capture pad 92 or trace 94. Instead, RDL capture pad 96 surrounds conductive via 88 such that conductive via 88 falls within capture pad 96 so that capture pad 96 can be coupled to, or directly contact, both via 88 and via 106.

As indicated above, when changes in the positions of semiconductor die 24, openings 82, and conductive vias 88 are small with respect to point of reference R3, no additional adjustments to the build-up interconnect structure, including to conductive RDL 90, may be required. Thus, the adaptive patterning for the packaging of semiconductor die 24 formed in panel 70 can include measuring the true position of semiconductor die 24, determining that the shifts or movement of the semiconductor die do not require changes to the pattern or design of conductive RDL 90, and forming conductive RDL 90 at a location previously determined with respect to panel 70 and point of reference R3, that is, without making adjustments for changes in position of semiconductor die 24 with respect to point of reference R3. Alternatively, if the changes in position of openings 82 are such that the nominal position of first via capture pad 92 does not provide sufficient contact with conductive via 88, then additional adjustments to the build-up interconnect structure can be made, as described below.

In an embodiment, conductive RDL 90 can be adaptively patterned for each true position of semiconductor die 24 by shifting an entirety of conductive RDL 90 associated with each semiconductor die 24 by an x-y translation, a rotation of an angle θ, or both with respect to point of reference R3 to adjust for the true position of semiconductor die 24. The adaptive patterning of conductive RDL 90 occurs with respect to contact pad 32 or conductive via 88 for each semiconductor die 24, as needed within panel 70. For example, a first portion of conductive RDL 90 disposed over semiconductor die 24a, designated as conductive RDL 90a in FIG. 2F, can be adjusted by an x-y translation, a rotation of an angle θ, or both according to the true position of semiconductor die 24a within panel 70 as measured with respect to point of reference R3. Similarly, a second portion of conductive RDL 90 disposed over semiconductor die 24b, designated as conductive RDL 90b in FIG. 2F, is adjusted by an x-y translation, a rotation of an angle θ, or both according to the true position of semiconductor die 24b within panel 70 as measured with respect to point of reference R3. Thus, by adjusting the position of conductive RDL 90 for each semiconductor die 24, conductive RDL 90 aligns with the true or actual position of semiconductor die 24 within panel 70. For example, a center 98 of first via capture pad 92 can be aligned with a center of conductive via 88 after conductive RDL 90 is formed with adaptive patterning. Furthermore, a good connection between contact pad 32, conductive via 88, and conductive RDL 90 is provided without increasing an area of via capture pads 92, and as such is suitable for fine pitch applications.

As a result of shifting the orientation or location of conductive RDL 90 for each semiconductor die 24, the offset created by the differences between the nominal and true positions of semiconductor die 24 with respect to an outer edge of a completed semiconductor package is transferred or shifted to an interface or interconnection between RDL capture pad 96 and a subsequently formed interconnect such as a second via, a UBM, or another suitable interconnect structure. Desirably, the position of the UBM pattern or other suitable interconnect structure is held constant and does not shift with respect to the edge of the package. Therefore, if the entire RDL pattern or conductive RDL 90 shifts with respect to the fixed UBM or interconnect structure pattern, the shift of conductive RDL 90 relative to the fixed position of the UBM pad should be considered, as discussed below, in order to ensure proper function and reliability of the final semiconductor package.

Figure 2H:
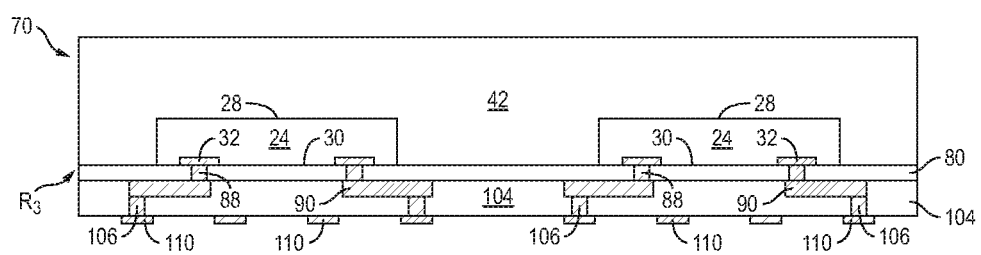

FIG. 2H, continuing from FIGS. 2F and 2G, shows a cross sectional view of wafer 70 similar to the view shown in FIG. 2F. FIG. 2H additionally shows an insulating or passivation layer 104 that is conformally applied to, and has a first surface that follows the contours of, insulating layer 80 and conductive RDL 90. Insulating layer 104 has a second planar surface opposite the first surface. Insulating layer 104 contains one or more layers of photosensitive low curing temperature dielectric resist, photosensitive composite resist, laminate compound film, insulation paste with filler, solder mask resist film, epoxy molding compound, SiO2, Si3N4, SiON, Al2O3, or other material having similar insulating and structural properties. Insulating layer 104 is deposited using printing, spin coating, spray coating, lamination, molding, or other suitable process. Insulating layer 104 is subsequently patterned and optionally cured.

A portion of insulating layer 104 is removed by etching, laser drilling, mechanical drilling, or other suitable process to form openings that extend completely through insulating layer 104 and expose a portion of conductive RDL 90, such as RDL capture pad 96. An electrically conductive layer is deposited in the openings in insulating layer 104 using PVD, CVD, electrolytic plating, electroless plating, or other suitable process to form conductive vias 106. Conductive vias 106 can be one or more layers of Al, Cu, Sn, Ni, Au, Ag, Ti, W, poly-silicon, or other suitable electrically conductive material. Conductive vias 106 form part of a build-up interconnect structure and provide vertical electrical connection with respect to contact pads 32, conductive vias 88, and conductive RDL 90.

In an embodiment, a position of conductive via 106 is formed at its nominal position with respect to point of reference R3 and panel 70 and aligns with RDL capture pads 96. Conductive vias 106 can align with RDL capture pads 96 because semiconductor die 24 has not shifted from its nominal position 106', or the shift of semiconductor die 24 and conductive RDL 90 is small with respect to point of reference R3 within panel 70. Alternatively, as discussed in greater detail below, conductive via 106 can be formed at its nominal position and be at least partially misaligned with RDL capture pad 96 because conductive RDL 90 and RDL capture pad 96 have been shifted with an x-y displacement, a rotation θ, or both to match semiconductor die 24.

FIG. 2H further shows a UBM pad or capture pad 110 formed over conductive vias 106 and insulating layer 104. In embodiments comprising more than two routing layers or RDLs, UBM pad 110 can be second fan-out RDL capture pads. UBM pads 110 can be stacks of multiple metal including adhesion, barrier, seed, and wetting layers. Layers of UBM pads 110 can be Ti, titanium nitride (TiN), titanium tungsten (TiW), Al, Cu, chromium (Cr), chromium copper (CrCu), Ni, nickel vanadium (NiV), Pd, platinum (Pt), Au, Ag or other suitable material or combination of materials. In an embodiment, UBM pads 110 comprise a TiW seed layer, a Cu Seed layer, and a Cu UBM layer. The TiW seed layer is conformally applied over insulating layer 104 and conductive vias 106. The Cu seed layer is conformally applied over the TiW seed layer. The Cu UBM layer is conformally applied over the TiW seed layer and the Cu seed layer. UBM pads 110 act as an intermediate conductive layer between conductive vias 106 and subsequently formed solder bumps or other input/output (I/O) interconnect structures. UBM pads 110 can provide a low resistive interconnect to conductive vias 106, a barrier to solder diffusion, and an increase in solder wettability.

Conductive via 106 can be formed within a footprint of its nominal position to allow for good electrical connection between conductive via 106 and UBM pad 110 while maintaining UBM pad 110 at its nominal position. By not subjecting UBM pads 110 to an x-y displacement, a rotation θ, or both with respect to its nominal position, the position of UBM pads 110—and subsequently formed electrical interconnects connected to the UBM pads—are aligned with package outlines 74 to facilitate accurate and precise connections to test sockets, circuit boards, or other structures to which the package might be connected. However, depending on the adaptive patterning including an x-y displacement, a rotation θ, or both of conductive RDL 90 to align with an actual position of semiconductor die 24, at least a partial misalignment between via 106 and RDL capture pad 96 can occur. Previously, a maximum allowable shift for semiconductor die 24 that would accommodate adapting an alignment of conductive RDL 90 while maintaining a pattern of the entire RDL constant was limited by an overlap between via 106 and the RDL capture pad. Allowing via 106 to extend beyond an edge of RDL capture pad 96 created a risk for electrical shorting between adjacent features on the RDL layer, thereby compromising the function and value of the finished semiconductor package.

Figure 2I:
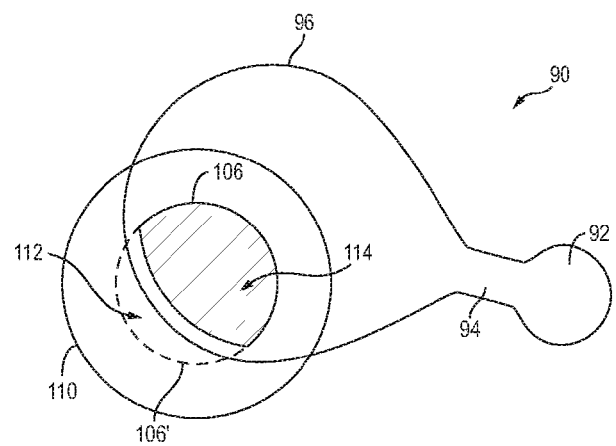

FIG. 2I, similar to FIG. 2G, shows a plan view of a portion of semiconductor wafer 70, shown previously in cross-sectional view in FIG. 2H, after formation of RDL 90, via 106, and UBM 110, in which clipped vias 106 accommodate the adaptive movement of RDL 90 based on the true position of semiconductor die 24 within wafer 70 and the true position of UBM 110 which remains constant or fixed with respect to its nominal position and a position of package outline 74. FIG. 2H shows a footprint or a cross-sectional size, shape, or both of via 106 is adjusted from a footprint of nominal via 106' to account for the misalignment between UBM pad 110 and RDL pad 96. Stated another way, one or more of a footprint, cross-sectional size, and cross-sectional shape of via 106 is adjusted from a footprint of nominal via 106' to account for the misalignment of semiconductor die 24 and package outline 74. Specifically, a footprint or cross-sectional area of via 106 undergoes dynamic clipping to adjust a shape, size, or both of nominal via 106' when nominal via 106' would extend beyond RDL capture pad 96 while being aligned to UBM pad 110. Via 106 is dynamically formed based on the true or actual position of RDL capture pad 96. The true position of RDL capture pad 96 can be determined by scanner 73, or inferred from a measurement of the true or actual position of semiconductor die 24.

Figure 2K:
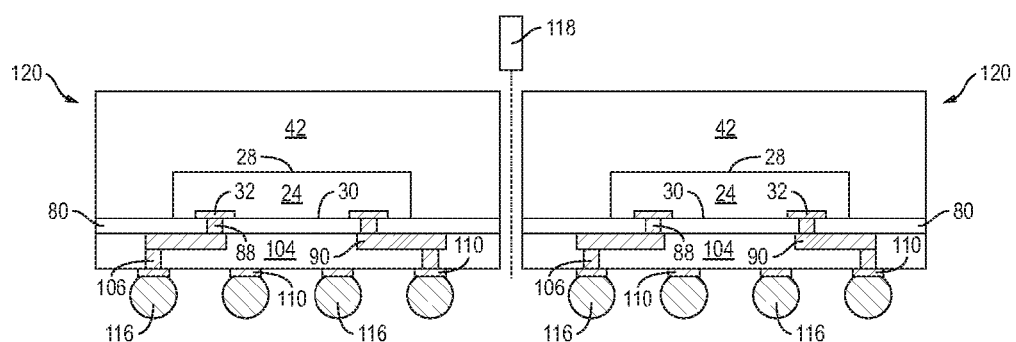
Figure 2J:
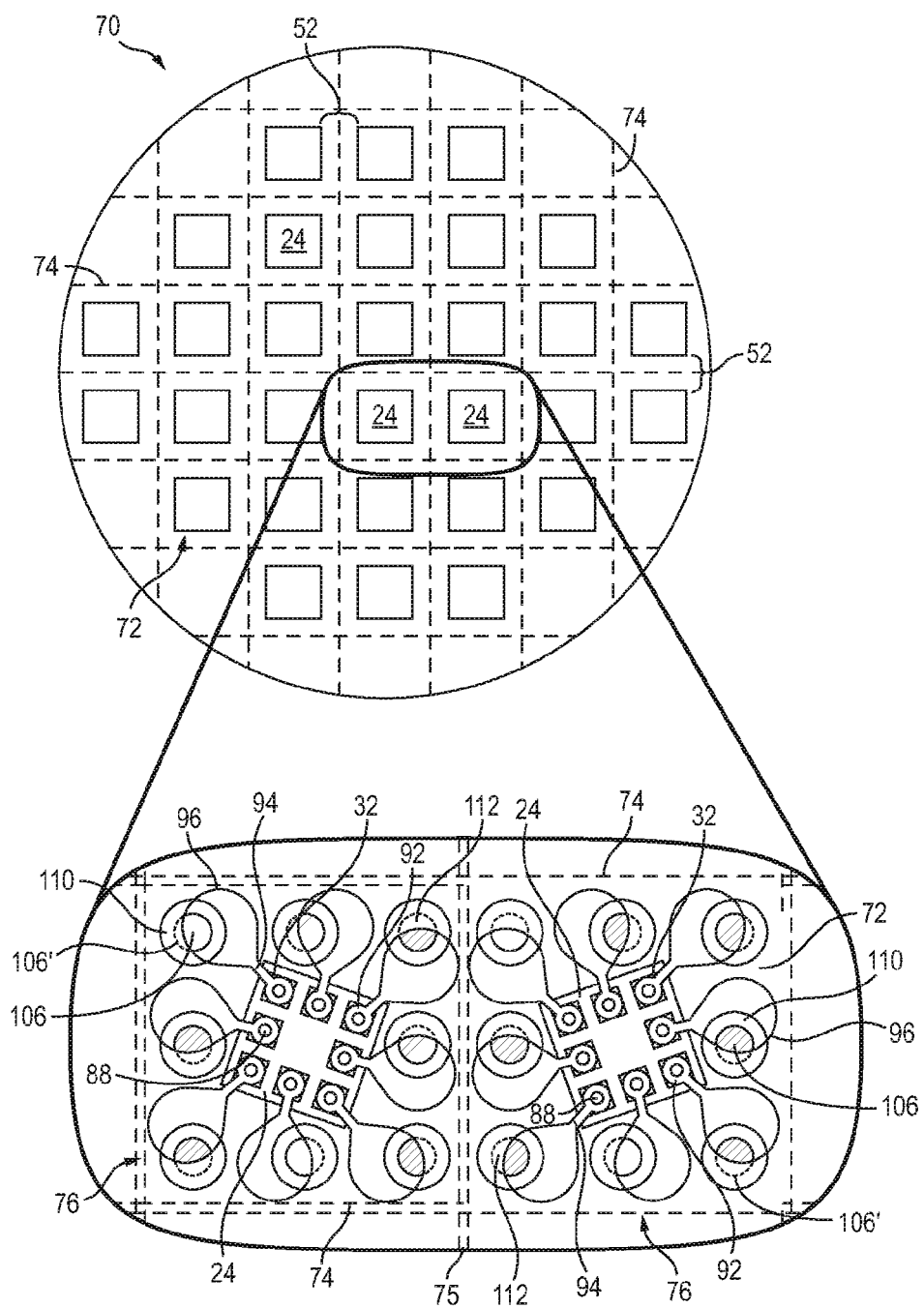

After obtaining an actual or true position of RDL capture pad 96, a footprint 114 of via 106—illustrated with cross-hatching in FIGS. 2I and 2J—is determined by clipping or removing portion 112 of nominal via 106' that extends beyond a footprint of RDL capture pad 96. An additional portion of nominal via 106' can also be removed within a footprint of RDL capture pad 96 to provide an offset or setback from an outer edge or perimeter of the RDL capture pad near via 106. In determining a footprint 114 of via 106, a center of nominal via 106' can remain aligned with UBM pad 110 or a center of the UBM pad. Additionally, a minimum acceptable area of a footprint 114 of via 106 can be ensured. A minimum acceptable area 112 can be selected and set based on the configuration, design, and operation of the completed WLCSP. In an embodiment, minimum acceptable area 112 can be an absolute minimum area, or can be determined as a percentage of the nominal area of the via that will provide acceptable mechanical and electrical performance characteristics according to the configuration and design of the semiconductor package. Depending on the attributes of the layers to be connected, such as contact pads 32, conductive RDL 90, and conductive via 106, a minimum acceptable area of the vias can be in a range of via sizes greater than or equal to 25% of a nominal a via area.

Having defined a minimum area for a footprint 114 of via 106, as described above, a maximum acceptable shift for semiconductor die 24 in terms of x-y displacement, a rotation θ, or both for the semiconductor die with respect to point of reference R3 can be determined for a given size of RDL capture pad 96. Because the maximum acceptable shift of semiconductor die 24 is a function of a maximum size of RDL capture pad 96, a larger RDL capture pad allows for a larger maximum acceptable shift. However, adjusting a footprint of RDL capture pad 96 can also undesirably increase routing pitch and decrease routing density. On the other hand, maintaining a fixed size for RDL capture pad 96 while adjusting a footprint 114 of via 106, as shown in FIG. 2I, allows for a larger maximum acceptable shift of semiconductor die 24 without undesirably increasing routing pitch and decreasing routing density.

Thus, an adaptive alignment method is applied in which an entire pattern of conductive RDL 90 is held constant and is moved as an entirety by an x-y displacement, rotation θ, or both to align first via capture pads 92 with contact pads 32. The UBM capture pad 110 and a center of nominal via 106' connecting to the RDL capture pad 96 can be held constant with respect to package outline 74. Instead of merely adjusting a size of conductive via 106 as part of the adaptive alignment method, a footprint 114 of via 106 can be modified to accommodate shifts of RDL 90 in which the maximum allowable shift is not limited by the nominal overlap between the via and the RDL capture pad to avoid extending via 106 beyond a footprint of RDL capture pad 96. Instead, the maximum die shift constraint is relieved by allowing a shape of the footprint 114 of via 106 to adapt to the shift in position of semiconductor die 124. By relieving the maximum die shift constraint through modifying a footprint size, footprint shape, or both, of via 106, the adaptive alignment method can be extended to semiconductor die comprising larger sizes, and to packages requiring higher densities. Additionally, a via size can be increased to a maximum extend practical, given a particular semiconductor die shift, to provide for increased mechanical strength and electrical functionality and reliability of the modified vias.

While the formation of via 106 has been discussed in terms of removing portion 112 of nominal via 106', a person of ordinary skill in the art will understand that nominal via 106' need not be literally or tangibly created such that removed portion 112 of nominal via 106' be physical or tangible. Instead, via 106 is formed with a footprint different from a footprint of nominal via 106', nominal via 106' representing a form of how via 106 would have been formed if there were no substantial displacement of semiconductor die 24 from point of reference R1. Accordingly, the clipping or removal of portion 112 of nominal via 106' can be done virtually or computationally as part of a method, system, or software. For example, data including a position of RDL capture pad 96 or a position of semiconductor die 24 can be imported into an adaptive pattern auto-router that creates a design or form of via 106 different from a design or form of nominal via 106'. A design can be created for an entirety of panel 107 comprising a plurality of vias 106 with differing footprints or variable via size and shape. The design can then be applied to panel 70 to create a plurality of vias 106 of varying footprints across for an entirety of panel 107. Thus, a plurality of conductive vias 106 can physically and electrically connect a plurality of RDL capture pads 96 with a plurality of UBM capture pads 110 without extending vias 106 beyond an edge of RDL capture pads 96 and creating a risk for electrical shorting between adjacent features on the RDL layer as shown in FIG. 2J.

The modification or truncation of vias 106 as shown in FIGS. 2F-2J, and described above, is also applicable to openings 82 and conductive vias 88 shown above in FIG. 2E. Openings 82 and conductive vias 88 can be modified and truncated as described above with respect to vias 106 if the resulting modified or truncated vias 88 would be large enough to provide adequate electrical and mechanical contact for the resulting semiconductor package. In an embodiment, vias 88 can be modified or truncated instead of, or in addition to, the modification or truncation of conductive vias 106. Modification and truncation of vias 88 can be advantageously employed for multi-chip modules or packages comprising more than one semiconductor die because an entire RDL pattern such as conductive RDL layer 90 could be held constant while vias such as vias 88 could be independently adjusted, modified, or truncated to electrically connect contact pads 32 of the two or more semiconductor die 24 included within the multi-chip package.

Modification or truncation of conductive vias 106 and openings 82, as described above, can be performed so that adjusting a nominal size, shape, or both, of conductive vias 106', or a nominal size, shape, or both of openings 82, can result in a size of modified via 106 being inversely proportional to the misalignment between semiconductor die 24 and package outline 74. In other words, the greater the misalignment between semiconductor die 24 and package outline 74, the smaller the size or area of conductive via 106 will be (such as a size of footprint 114). On the other hand, the smaller the misalignment between semiconductor die 24 and the package outline 74, the greater the size of conductive via 106 will be. Accordingly, as the misalignment between semiconductor die 24 and package outline 74 approaches zero, a size and shape of the actual conductive via 106 approaches a size and shape of the nominal conductive via 106'.

Similarly, a size, shape, or both, of nominal via 106' can be adjusted so that a size, shape, or both, of modified or conductive via 106 is inversely proportional to a distance from a center of the semiconductor die. In other words, the greater the distance between conductive via 106 and a center or fixed point on semiconductor die 24, the smaller the size of the conductive via will be to account for decreased overlap among package features. On the other hand, the smaller the distance between conductive via 106 and a center or fixed point on semiconductor die 24, the greater the size of conductive via 106 will be to account for increased overlap among package features or to account for lesser misalignment between various package features. Accordingly, as the distance between conductive via 106 and a center or fixed point on semiconductor die 24 increases, misalignment between semiconductor die 24 and a package feature will also increase.

While the above discussion has used the package feature of conductive via 106 as a non-limiting example to describe how a size of conductive via 106 is inversely proportional to a distance from a center of the semiconductor die, other package features can likewise have a size that is inversely proportional to the distance from the center of the semiconductor die. Other package features sharing in this relationship can include, without limitation, portions of conductive RDL 90, capture pad 96, UBM capture pad 110, and footprint 114, each of which can be modified to account for diminished overlap among package features or to account for greater misalignment between various package features. As another non limiting example, consider the case of a semiconductor package 120 comprising at least first and second rows of UBM pads 110 coupled to conductive vias 106 in which the first row of UBM pads 110 is offset a first distance from the center of semiconductor die 24 and the second row of UBM pads 110 is offset a second distance from the center of semiconductor die 24 greater than the first distance. In such a case, the greater distance between the second row of UBM pads 110 and the center of semiconductor die 24 can result in conductive vias 106 coupled to the second row of UBM pads 110 having a smaller size than a size of conductive vias 106 coupled to the first row of UBM pads 110. Additionally, the misalignment of conductive vias 106 coupled to the second row of UBM pads can be greater than the misalignment of conductive vias 106 coupled to the first row of UBM pads.

FIG. 2K shows an electrically conductive bump material is deposited over UBMs 110 and conductive vias 106 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBMs 110 using a suitable attachment or bonding process. In an embodiment, the bump material is reflowed by heating the material above its melting point to form spherical balls or bumps 116. In some applications, bumps 116 are reflowed a second time to improve electrical contact to UBMs 110. The bumps can also be compression bonded to UBMs 110. Bumps 116 represent one type of interconnect structure that can be formed over UBMs 110. The interconnect structure can also use conductive paste, stud bump, micro bump, or other electrical interconnect.

FIG. 2K also shows that after the formation of bumps 116, panel or reconstituted wafer 70 is singulated using a saw blade or laser cutting tool 118 to form individual semiconductor packages or embedded die packages 120. Because UBM pads 110 and bumps 116 are not adaptively adjusted for movement of semiconductor die 24 within panel 70 and are formed in accordance with their nominal design positions, bumps 116 are aligned with package outline 74 and a periphery of an outer package profile of semiconductor packages 120.

Accordingly, FIGS. 2A-2K show a method of making semiconductor packages 120, wherein the first via layer and at least a portion of the RDL routing layer is shifted from its nominal position on the panel to align with the true position of each semiconductor die. By so doing, at least the package I/O interconnects maintain alignment with the edge of the finished package to comply with a package outline drawing, facilitate package testing, and eliminate yield loss caused by misalignment of semiconductor die during panelization. Implementation of adaptive patterning can use programmable direct write exposure and laser ablation methods to allow for the adjustment of the shape, position, and orientation of vias and RDL layers to align with each individual semiconductor die within panel 70. In addition to increasing yield, the proposed process corrects for movement of die during cure and therefore enables smaller die bond pad geometry and increased densities.

Accordingly, the method of adaptive patterning disclosed herein allows for a position of the fan-out RDL layer to be adjusted to align to features on an embedded semiconductor die. An array of UBM or package I/O pads are held constant with respect to the package outline and a via connecting a capture pad on the RDL layer to the UBM pad is clipped to change a size, shape, or both of the UBM pad depending on the magnitude and direction of the shift of the semiconductor die within an encapsulant with respect to a nominal position of the semiconductor die. The disclosed adaptive patterning method enhances adaptive patterning capability and provides the ability to apply adaptive rotation to semiconductor device packages comprising larger body sizes.

Figure 3:
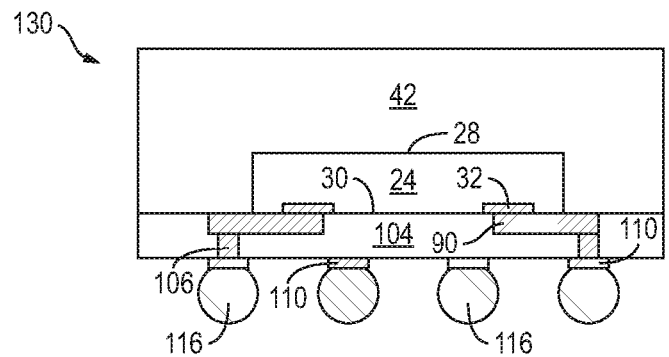
FIG. 3 illustrates a cross-sectional side view of an embodiment of a semiconductor package comprising adaptively patterned conductive vias.

FIG. 3 shows an individual semiconductor package or embedded die package 130 similar to semiconductor package 120 from FIG. 2K. Semiconductor package 130 differs from semiconductor package 120 by omitting optional insulation or passivation layer 80 such that electrically conductive layer 90 is patterned and deposited over, and can be in direct contact with, semiconductor die 24 and encapsulant 42 instead of insulating layer 80.

Figure 4:
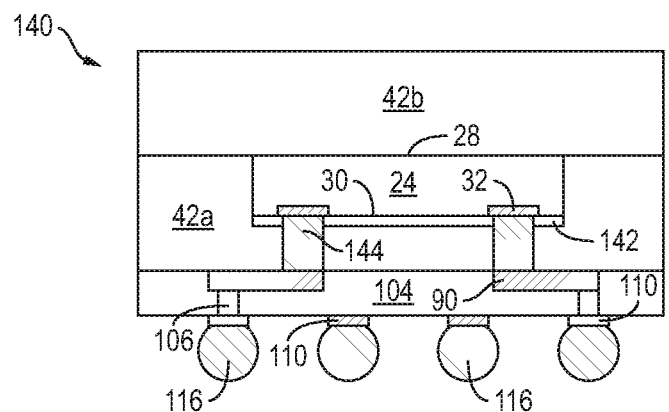
FIG. 4 illustrates a cross-sectional side view of another embodiment of a semiconductor package comprising adaptively patterned conductive vias.

FIG. 4 shows an individual semiconductor package or embedded die package 140 similar to semiconductor package 120 from FIG. 2K. Semiconductor package 140 differs from semiconductor package 120 by the inclusion of conductive posts or pillars 144 instead of conductive vias 88. As such, semiconductor package 140 can be formed as a face-down fully molded semiconductor package in which encapsulant 42 is disposed around all sides of semiconductor die 24. Alternatively, semiconductor package 140 can be formed as a face-up molded semiconductor package a first encapsulant 42a can be disposed over, and adjacent to, active surface 30 and a plurality of side surfaces, such as four side surfaces, disposed between the active surface and back surface 28. A second encapsulant 42b can also be disposed over backside 28 and encapsulant 42a. Because of the face-down fully molded design, optional insulation or passivation layer 80 from FIG. 2K is replaced in FIG. 4 by an optional insulation or passivation layer 142. However, the methods and structures of the adaptive patterning comprising via clipping from semiconductor package 120, including electrically conductive layer 90, conductive vias 106, and UBM pads 110 can be unchanged with respect to their inclusion within semiconductor package 140.

Figure 5:
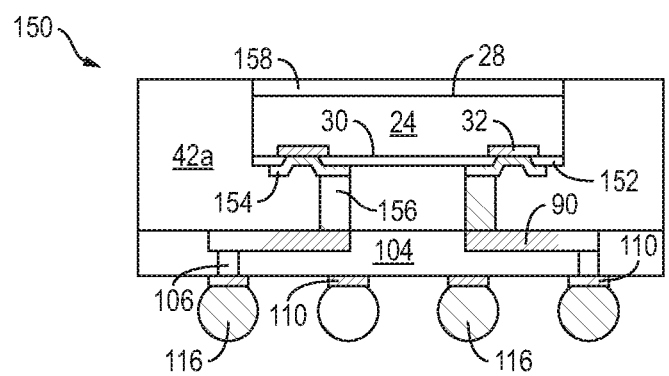
FIG. 5 illustrates a cross-sectional side view of another embodiment of a semiconductor package comprising adaptively patterned conductive vias.

FIG. 5 shows an individual semiconductor package or embedded package 150 similar to semiconductor package 140 from FIG. 4. Semiconductor package 150 differs from semiconductor package 140 by the inclusion of an electrically conductive layer 154 that can be configured as a fan-in redistribution layer. As such, conductive posts or pillars 156 differ from conductive posts 144 in that conductive posts 156 comprise a first end coupled to conductive layer 154 and a second end opposite the first end coupled to electrically conductive layer or RDL 90.

Semiconductor package 150 also differs from semiconductor package 140 by inclusion of an optional die attach adhesive or interface layer 158, instead of encapsulant 42b, that can be disposed over and in direct contact with backside 28 of semiconductor die 24. Adhesive 158 can comprise a footprint substantially equal to a footprint of semiconductor die 24, or alternatively, adhesive 158 can comprise a footprint substantially equal to a footprint of semiconductor package 150. However, the methods and structures of the adaptive patterning comprising via clipping from semiconductor package 120, including conductive vias 88, electrically conductive layer 90, conductive vias 106, and UBM pads 110 can be unchanged with respect to their inclusion within semiconductor package 150.

Figure 6:
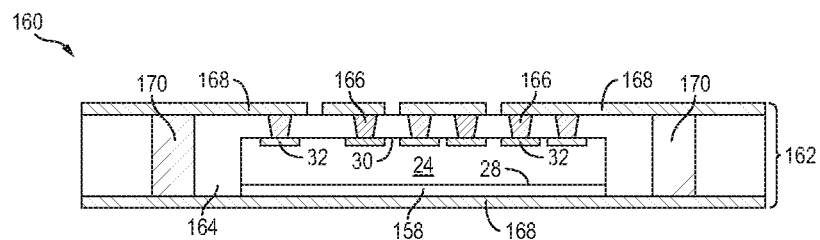
FIG. 6 illustrates a cross-sectional side view of another embodiment of a semiconductor package disposed within a substrate.

FIG. 6 shows another embodiment of a semiconductor package or embedded die package 160 comprising semiconductor die 24 disposed within substrate 162. Substrate 162 can comprise a chip carrier substrate, PCB, printed wiring panel, or any suitable rigid, semi-rigid, or flexible structure that can provide general structural support and electrical interconnect for semiconductor package 160 including semiconductor die 24 and any number of microprocessors, memories, ASICs, logic circuits, analog circuits, RF circuits, discrete devices, or other semiconductor die or electrical components. Substrate 162 can be single-sided, two-sided, or multi-layered and include an inner layer 164 into which semiconductor die 24 is disposed.

Semiconductor package 160 can be formed by introducing semiconductor die 24, which can be a thinned semiconductor die, a buried semiconductor die, or both, into inner layer 164 of substrate 162. Semiconductor die 24 can be buried in a cavity within inner layer 164. Semiconductor die 24, and in the case of a multi-layer substrate, can also be added to a surface of one of a plurality of inner layers 164 of substrate 162, after which build-up technology can then be used to construct a board sandwich with layers disposed above and below the semiconductor die. As shown in FIG. 6, semiconductor die 24 can be attached to substrate 162 using optional adhesive 158. By disposing semiconductor die 24 within substrate 162 a reduced footprint and improved signal performance can be achieved while utilizing concepts of 3D package integration.

Semiconductor die 24 can be electrically connected to points outside of the semiconductor die through conductive vias or electrical interconnects 166, conductive RDL 168, and through-substrate conductive vias 170. Conductive vias 166 can be formed using PVD, CVD, electrolytic plating, electroless plating, or other suitable process. Conductive vias 166 can be one or more layers of Al, Cu, Sn, Ni, Au, Ag, Ti, W, poly-silicon, or other suitable electrically conductive material. Conductive vias 166 form part of the build-up interconnect structure and provide vertical electrical connection with contact pads 32 of semiconductor die 24.

Similarly, conductive vias 170 can be formed using PVD, CVD, electrolytic plating, electroless plating, or other suitable process. Conductive vias 170 can also be one or more layers of Al, Cu, Sn, Ni, Au, Ag, Ti, W, poly-silicon, or other suitable electrically conductive material. Conductive vias 170 can be formed completely through substrate 162 and extend between opposing first and second surfaces of the substrate to provide electrical interconnect between opposing sides of the substrate. Conductive vias 170 can be formed at a same or different time and with a same or different process than conductive vias 166.

Conductive RDL 168 can be patterned and deposited over the opposing first and second surfaces of substrate 162 and be electrically connected and physically coupled to conductive vias 166 and conductive vias 170. Conductive RDL 168 can be one or more layers of Al, Cu, Sn, Ni, Au, Ag, or other suitable electrically conductive material. The deposition of conductive RDL 168 can use PVD, CVD, electrolytic plating, electroless plating, or other suitable process. In an embodiment, conductive RDL 168 is formed together, and at a same time, with conductive vias 166 and 170. Alternatively, conductive vias 166 and 170 can be formed as part of separate processes and at different times. Conductive RDL 168 can also be formed across an entirety of substrate 162, or across a portion of substrate 162 that is less than an entirety of the substrate.

As discussed above with respect to FIGS. 2A-2K, a position of semiconductor die 24 can be shifted or change within panel 70 so that a nominal position and actual position of the semiconductor die within the panel can be different or vary. As such, a shape, size, or both of conductive vias 88, conductive vias 106, or both, can be dynamically clipped or adjusted so that a shape, size, or both of conductive vias 88 and 106 are adjusted to accommodated the differences between actual and nominal positions of semiconductor die 24 within panel 70. Similarly, a position of semiconductor die 24 can be shifted or changed within substrate 162 so that a nominal position and actual position of the semiconductor die within the panel can be different or vary. As such, a shape, size, or both of conductive vias 166 can be dynamically clipped or adjusted so that a shape, size, or both of conductive vias 166 can be adjusted to accommodated the differences between actual and nominal positions of semiconductor die 24 within substrate 162, similar to how a shape, size, or both conductive vias 88 and 106 can be adjusted as described above. Accordingly, dynamically clipped vias 166 can be used to account for, and correct differences between, a nominal position of semiconductor die 124 and an actual position of the semiconductor die.

In view of the above description with respect to semiconductor packages and embedded die packages 120, 130, 140, 150, and 160, a method of dynamically clipping or adjusting a size, shape, or both of a via based on a fixed position and a variable position. The variable position can be an actual position of a semiconductor die that differs or varies from a nominal or anticipated position of the semiconductor die. The fixed position can be the actual position of a routing layer, such as RDL 90 or 168, that is equal to nominal position of the routing layer, and is formed with a fixed position and orientation, with respect to a same frame of reference that is used to calculate the variable position or the difference between the nominal and actual position of the semiconductor die.

More broadly stated, the present disclosure relates to a method of dynamically clipping or adjusting a size, shape, or both of a conductive via based on a fixed position of a first conductive feature and a variable position of a second conductive feature, wherein the fixed and variable positions are measured with respect to a same frame of reference. Accordingly, the first and second conductive features can include any conductive features, such as two routing layers or RDLs, two semiconductor die, one semiconductor die and one RDL, or two or more of any number of microprocessors, memories, ASICs, logic circuits, analog circuits, RF circuits, discrete devices, conductive traces, routing layers, RDLs, conductive interconnect, or other electrical components.

In the foregoing specification, various embodiments of the disclosure have been described. It will, however, be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A semiconductor package, comprising:
    a semiconductor die surrounded by an encapsulating material;
    a first capture pad aligned with an actual position of the semiconductor die;
    a second capture pad partially disposed over the first capture pad and aligned with an outline of the semiconductor package;
    an overlap area defined by a footprint common to a footprint of the first capture pad and a footprint of the second capture pad; and
    a conductive via disposed between and connecting the first capture pad and the second capture pad, the conductive via comprising a size less than a size of the overlap area, a modified shape of the conductive via accounting for a misalignment between the semiconductor die and the outline of the semiconductor package.

2. The semiconductor package of claim 1, wherein the semiconductor die surrounded by the encapsulating material is formed as part of a substrate, the substrate comprising a panel, reconstituted wafer, chip carrier substrate, PCB, or printed wiring panel.

3. The semiconductor package of claim 1, wherein the first capture pad comprises a contact pad of the semiconductor die.

4. The semiconductor package of claim 1, wherein:
    the first capture pad comprises an RDL capture pad; and
    the second capture pad comprises an under bump metallization (UBM) pad or land grid array (LGA) pad offset from the RDL capture pad.

5. The semiconductor package of claim 1, wherein the size of the overlap area is inversely proportional to a distance from a center of the semiconductor die.

6. The semiconductor package of claim 1, further comprising:
    a conductive post coupled to the semiconductor die;
    a conductive RDL formed over the semiconductor die and the encapsulating material, the conductive RDL being coupled to the conductive post; and
    wherein the first capture pad or the second capture pad is formed as part of the conductive RDL.

7. The semiconductor package of claim 1, further comprising a minimum via area, wherein the footprint of the conductive via comprises an area greater than or equal to the minimum via area, the minimum via area defining a maximum misalignment between the semiconductor die and the outline of the semiconductor package.

8. A semiconductor package, comprising:
    a semiconductor die;

a first capture pad aligned with an actual position of the semiconductor die;

a second capture pad partially disposed over the first capture pad and aligned with an outline of the semiconductor package;

an overlap area defined by a footprint common to a footprint of the first capture pad and a footprint of the second capture pad; and a conductive via disposed between and connecting the first capture pad and the second capture pad, the conductive via comprising a modified size that is less than a size of the overlap area, the modified size of the conductive via accounting for a misalignment between the semiconductor die and the outline of the semiconductor package.

9. The semiconductor package of claim 8, wherein the first capture pad comprises a contact pad of the semiconductor die.

10. The semiconductor package of claim 8, wherein the size of the overlap area is inversely proportional to the misalignment between the semiconductor die and the outline of the semiconductor package.

11. The semiconductor package of claim 8, wherein the size of the overlap area is inversely proportional to a distance from a center of the semiconductor die.

12. The semiconductor package of claim 8, further comprising:

a conductive post coupled to the semiconductor die;

a conductive RDL formed over the semiconductor die and an encapsulating material, the conductive RDL being coupled to the conductive post; and wherein the first capture pad or the second capture pad is formed as part of the conductive RDL.

13. The semiconductor package of claim 8, further comprising a minimum via area, wherein a footprint of the conductive via comprises an area greater than or equal to the minimum via area, and wherein the minimum via area defines a maximum misalignment between the semiconductor die and the outline of the semiconductor package.

14. The semiconductor package of claim 8, wherein the semiconductor die is surrounded by an encapsulating material to form part of a substrate, the substrate comprising a panel, reconstituted wafer, chip carrier substrate, PCB, or printed wiring panel.

15. A semiconductor package, comprising:

a semiconductor die;

a first capture pad aligned with an actual position of the semiconductor die; and a conductive via coupled to the first capture pad, the conductive via comprising a modified size or shape, the modified size or shape of the conductive via accounting for a misalignment between the semiconductor die and an outline of the semiconductor package.

16. The semiconductor package of claim 15, wherein the first capture pad comprises a contact pad of the semiconductor die.

17. The semiconductor package of claim 15, further comprising:

a second capture pad; and an overlap area defined by a footprint common to a footprint of the first capture pad and a footprint of the second capture pad;

wherein the size of the overlap area is inversely proportional to the misalignment between the semiconductor die and the outline of the semiconductor package.

18. The semiconductor package of claim 15, further comprising:

a second capture pad; and an overlap area defined by a footprint common to a footprint of the first capture pad and a footprint of the second capture pad;

wherein the size of the overlap area is inversely proportional to a distance from a center of the semiconductor die.

19. The semiconductor package of claim 15, further comprising:

an encapsulating material surrounding the semiconductor die;

a conductive post coupled to the semiconductor die;

a conductive RDL formed over the semiconductor die and the encapsulating material, the conductive RDL being coupled to the conductive post; and wherein the first capture pad is formed as part of the conductive RDL.

20. The semiconductor package of claim 15, further comprising a minimum via area, wherein a footprint of the conductive via comprises an area greater than or equal to the minimum via area, and wherein the minimum via area defines a maximum misalignment between the semiconductor die and the outline of the semiconductor package.

* * * * *